United States Patent [19]

Altekrüger

[11] Patent Number: 5,360,480
[45] Date of Patent: Nov. 1, 1994

[54] APPARATUS FOR CONTINUOUSLY FEEDING MATERIAL TO A MELTING CRUCIBLE

[75] Inventor: Burkhard Altekrüger, Alzenau, Germany

[73] Assignee: Leybold AG, Hanau, Germany

[21] Appl. No.: 70,567

[22] Filed: Jun. 1, 1993

[30] Foreign Application Priority Data

Jun. 2, 1992 [DE] Germany ............... 4218123

[51] Int. Cl.5 .................................. C30B 29/06
[52] U.S. Cl. ................................. 717/214; 117/208
[58] Field of Search ......... 156/617.1, 618.1, DIG. 83, 156/DIG. 115; 422/249, 251, 253

[56] References Cited

U.S. PATENT DOCUMENTS

| | | | |
|---|---|---|---|
| 2,908,739 | 10/1959 | Rummeh | 156/DIG. 83 |
| 4,762,687 | 8/1988 | Belomet et al. | 422/253 |
| 5,037,503 | 8/1991 | Kajimoto et al. | 156/DIG. 115 |
| 5,180,562 | 1/1993 | Drechsel et al. | 156/617.1 |
| 5,242,531 | 9/1993 | Klingshirn et al. | 156/617.1 |

FOREIGN PATENT DOCUMENTS

3737051 5/1989 Germany .
4106589 9/1992 Germany .

Primary Examiner—R. Bruce Breneman
Assistant Examiner—Felisa Garrett
Attorney, Agent, or Firm—Felfe & Lynch

[57] ABSTRACT

A prefusing crucible in a closed prefusing tank is provided above a melting crucible in a closed vacuum container. Prefusing the charge material prevents thermal shock to the melt in the crucible from which monocrystals are drawn. A cover provided over the overflow from the prefusing crucible acts as a dust trap.

11 Claims, 4 Drawing Sheets

APPARATUS FOR CONTINUOUSLY FEEDING MATERIAL TO A MELTING CRUCIBLE

BACKGROUND OF THE INVENTION

The invention relates to an apparatus for the continuous feeding of charge material to a melting crucible in the pulling of monocrystals in a closable container with a lock valve and a discharge tube leading into the crucible.

In the semiconductor industry, silicon substrates are desirable which have a uniform quality throughout. In the production of the melt with the known apparatus, a varying distribution of the dopants occurs due to varying temperatures in the melt. Metals produced in this manner have different properties and resistance coefficients, which is not desirable. For this reason the crucible in the prior-art method for the drawing of monocrystals has been run down to 50% and then refilled with fresh granules or undoped silicon. The process is thus frequently interrupted so that such apparatus have not been able to operate economically. Consequently attempts have been made to feed fresh granules continuously during the working process. However, in the known system problems are involved in the feeding of granules and the dust that it raises, plus a possible disturbance of the temperature equilibrium by the directly doped granules.

U.S. Pat. No. 5,180,562 discloses a crucible to hold the melt, a heating system with a pulling means above the melt, and a cover with an opening. The heater required for this purpose is of a ring-like construction. The granules are melted by a separate heater in the external part of a divided crucible. With this known apparatus a variety of processes have to be performed in a very tight space. For one thing, the conditions for melting must be established, and on the other hand the crystal in the inner area must be pulled without disturbance, i.e., without vibration and thermal shock.

SUMMARY OF THE INVENTION

Accordingly, the problem addressed by the invention is to create an apparatus for pulling monocrystals, which will be continuously charged and prevents entry of dust particles, and can operate thermally isolated and entirely free of disturbance.

In accordance with the invention, the charge material for the melting crucible is pre-fused and fed to the melting crucible in the molten state. In this manner, high purity and quality are obtained in a simple manner for the growing of crystals. Any disturbance of crystal growth by dust particles and thermal shock can be prevented by the continuously operating apparatus according to the invention, since the feeding of the granules takes place outside of the melting crucible of the pulling apparatus.

A closed pre-fusing tank is provided above the inlet opening of the pot for pre-fusing the charge material or granules and delivering them in the molten state to the melting crucible. Dust will only be raised in this tank. Since the cold granules are not fed directly to the melting tank, disturbances of the temperature distribution in the crystallization zone can be prevented. The dust remains in the outer area (pre-fusing tank) and does not get into the inner area of the melting crucible. This preliminary melting of the charge material also permits a reduction of the formerly high heating power in the area of the melting crucible.

The granular charge material is preferably fed into the pre-fusing crucible from a hopper through a feed tube. Only as much material is fed to the pre-fusing tank as is needed for the ongoing pull.

The pre-fusing crucible has an overflow system with a cover to assure that no dust or impurities enter the pulling apparatus. In one embodiment, the pre-fusing crucible is made of quartz or silicon. The crucible itself is melted so that molten silicon or silica is carried through the overflow.

To this end it is advantageous that the overflow system divide the pre-fusion tank into an annular chamber to accommodate the charge material, and that the overflow system through which the molten silicon or silica is guided be disposed concentrically in the pre-fusion tank.

The pre-fusion crucible may be heated by a resistance or induction heater which is disposed between the supporting crucible and an annularly configured external insulator made of graphite.

It is also possible to provide the pre-fusion tank with a cooling system, and to fuse the charge material in a cooled silicon bed, with the fusing power delivered by a scanning electron beam.

It is also advantageous to provide a silicon source or a cooled silicon block as the pre-fusion crucible and melt it or scan it by means of the heater so that a part of the silicon block is melted out to form an overflow channel. The electron beam can simply melt at least one groove into the surface of the silicon block so that then the material melted out can be fed to the pulling system through the overflow channel that has been formed.

DETAILED DESCRIPTION OF THE PREFERRED EMBODIMENT

Figure 1:
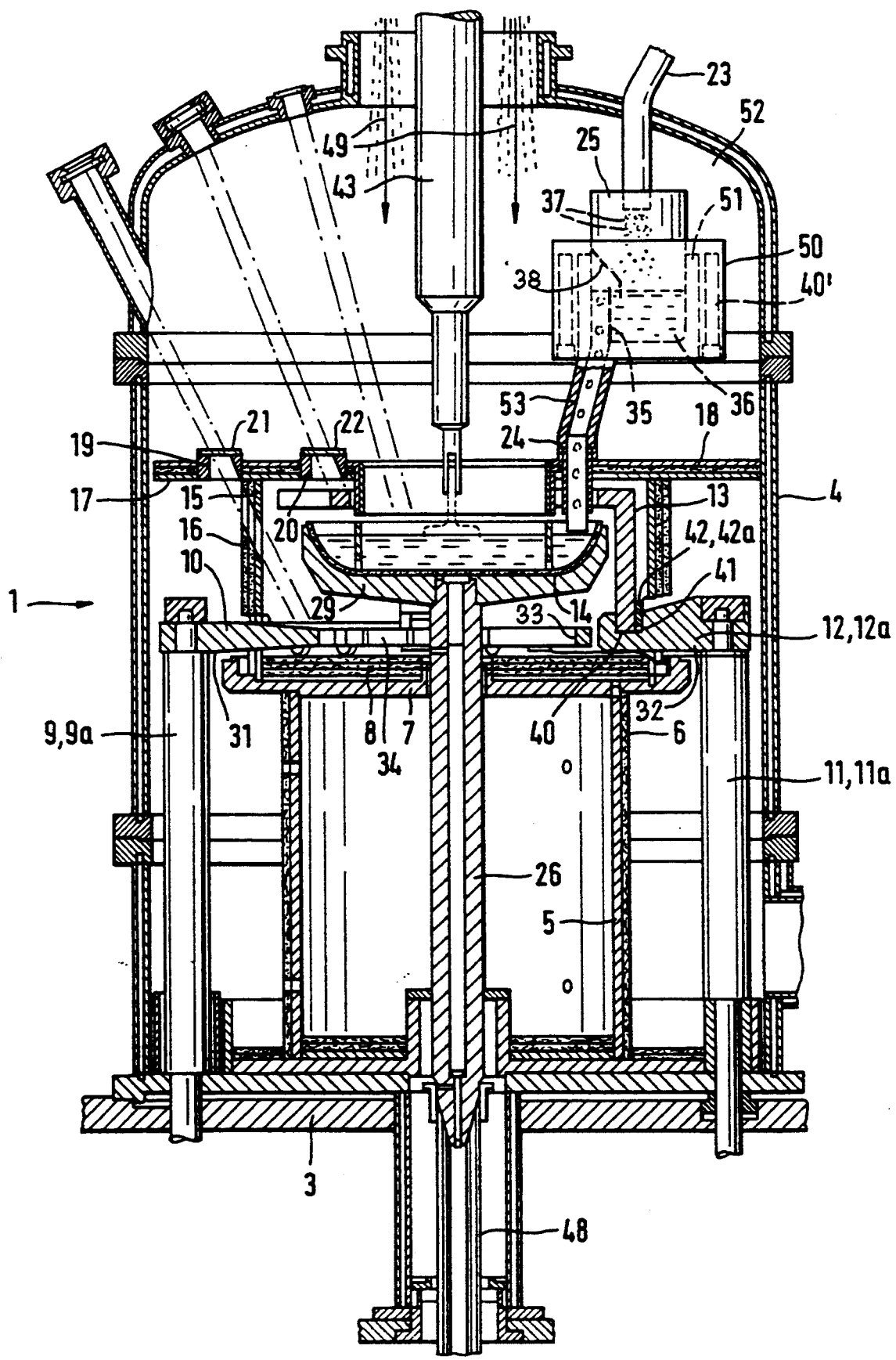
FIG. 1 shows a partial view in longitudinal section of an apparatus for pulling monocrystals.

An apparatus 1 for pulling monocrystals includes a double-walled pot 4 placed upon a likewise double-walled pot bottom plate 3 of the frame of the apparatus. The pot 4 has a vacuum chamber 52 as well as a supporting tube 5 disposed in the pot 4 and mounted on the bottom plate 3 thereof, with a thermal insulator 6 surrounding it. The tube 5 supports a pan 7 with graphite felt plates 8 mounted therein. Two power conductors 9 and 9a are mounted on the tank bottom plate 3 for a bottom heater 10 held above the pan 7. Clamp jaws 12 and 12a are bolted on two additional power conductors 11 and 11a and bear a face heater or cylinder heater 13. A tubular radiation shield 15 with lateral heat insulation 16 is supported on the pan 7, and a cover plate 17 is held by the tubular radiation shield and has a top heat insulator 18 and lead-throughs 19 and 20 with protective glasses 21 and 22, a feed tube 23 for the charge material or granules 37, and a filler funnel 24 with a feed tube 23 connected thereto. A melting crucible 14 is mounted on a crucible stem 26 which can be raised and lowered by a rotatable crucible shaft 48.

The charge material or granules 37 are delivered through the feed tube 23 into a pre-fusing crucible 25 and then to a divided crucible 14. The bottom heater 10 held by the two power conductors 9 and 9a consists of two heating coils 33 and 34 which together form an opening in the center of the bottom heater through which the crucible stem 26 reaches, which is affixed at its upper end to the melting crucible 14 and by which the melting crucible 14 can be moved up and down as well as rotated.

The face heater 13 is constituted by an annular, flat part and a hollow-cylindrical side wall with slots running radially. The hollow-cylindrical part is provided at two opposite portions with downwardly reaching heater legs 40 (only one heater leg is represented in FIG. 1), each engaged in recesses 41 which are provided in the two clamp jaws 12, 12a, held by the power conductors 11 and 11a. To assure a reliable passage of current from the face heater 13 into the recesses 41 of the clamp jaws 12 and 12a, additional wedges 42 and 42a are driven into the tapered recesses 41. Additional details of the apparatus will be found in U.S. Pat. No. 5,180,562 which is incorporated herein by reference.

To prevent dust from being raised, the charge material or granules 37 are fed through the feed tube 23 to a prefusing crucible 25 in a closed prefusing tank. A cover 38 serves as a dust trap to prevent dust from entering the overflow system 35 which provides molten material from the top surface of the molten material to the crucible therebelow. In FIG. 3 the cover 38 is aligned concentrically with the feed tube 23 and the overflow system 35. It is also possible, in accordance with FIG. 2, to align the feed tube 23 off-center from the overflow system 35 and cover 38.

The pre-fusing crucible 25 is situated between a hopper for the granules 37, not shown in the drawing, and the charging funnel 24 through which the molten material is fed to the melt crucible 14. Suitable apparatus for continuous feed of granules is disclosed in DE-A 3737051.

The pre-fusing crucible 25 is heated by a radiant heater 40' which is provided between a graphite supporting crucible 51 accommodating the pre-fusing crucible 25, and an insulator 50. The heater 40' can also be in the form of a resistance heater.

The use of the pre-fusing crucible 25 achieves isolation between the actual process of melting the granules, the heating means 40, and the pulling means 43.

Figure 2:
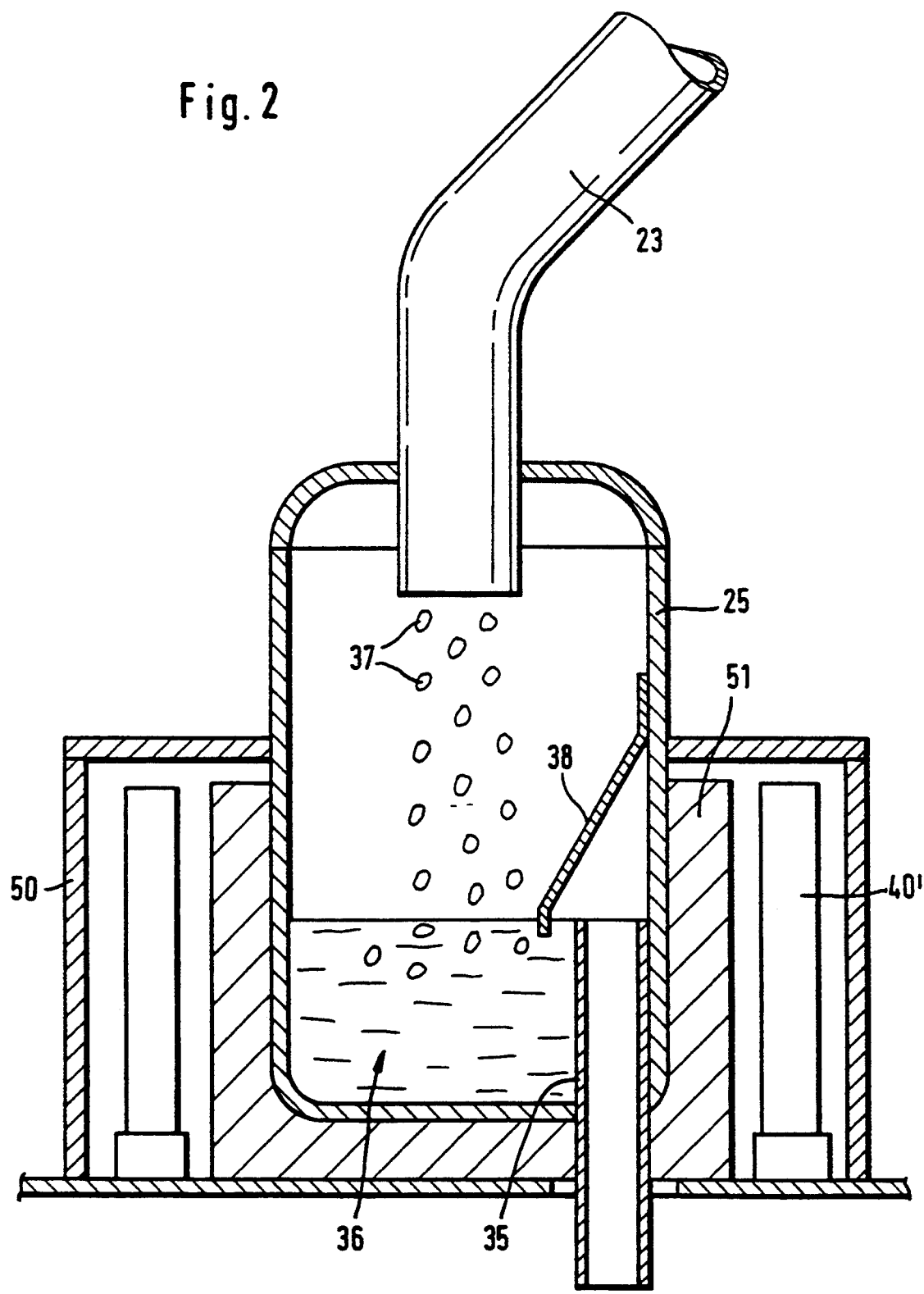
FIG. 2 shows a first embodiment of the pre-fusion crucible with laterally disposed overflow.
Figure 3:
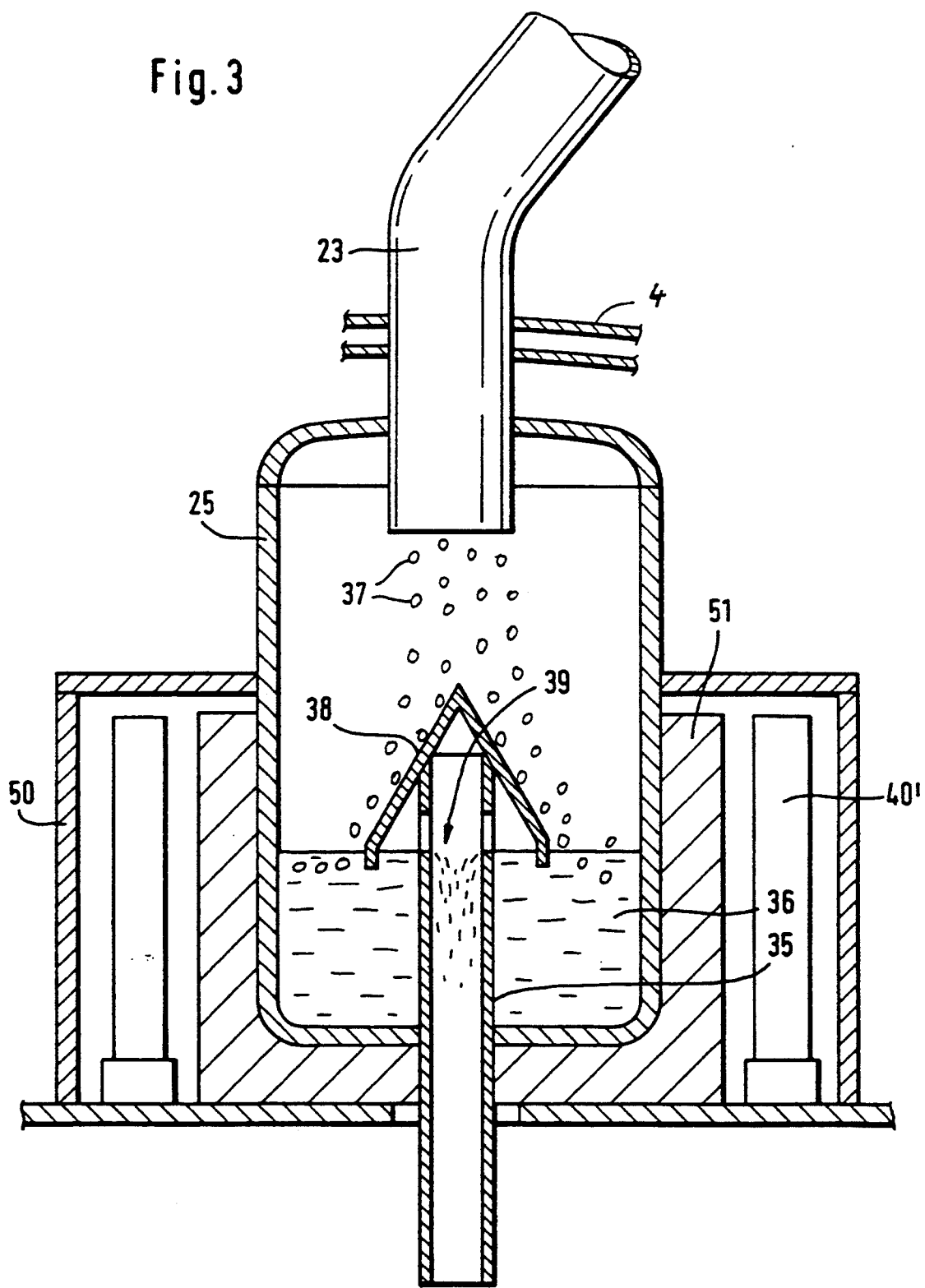
FIG. 3 shows a second embodiment of the pre-fusion crucible with concentrically disposed overflow.

In FIGS. 2 and 3, the pre-fusing crucible 25 has an overflow system formed by a drain tube 35. In FIG. 2 the drain tube is provided to the side of chamber 36. In FIG. 3 it is provided concentrically in crucible 25 to form an annular chamber 36. In both embodiments the tube 35 is protected by cover 38.

The pre-fusing crucible 25 can be made of quartz (SiO$_2$) and is held in a supporting crucible 51.

Figure 4:
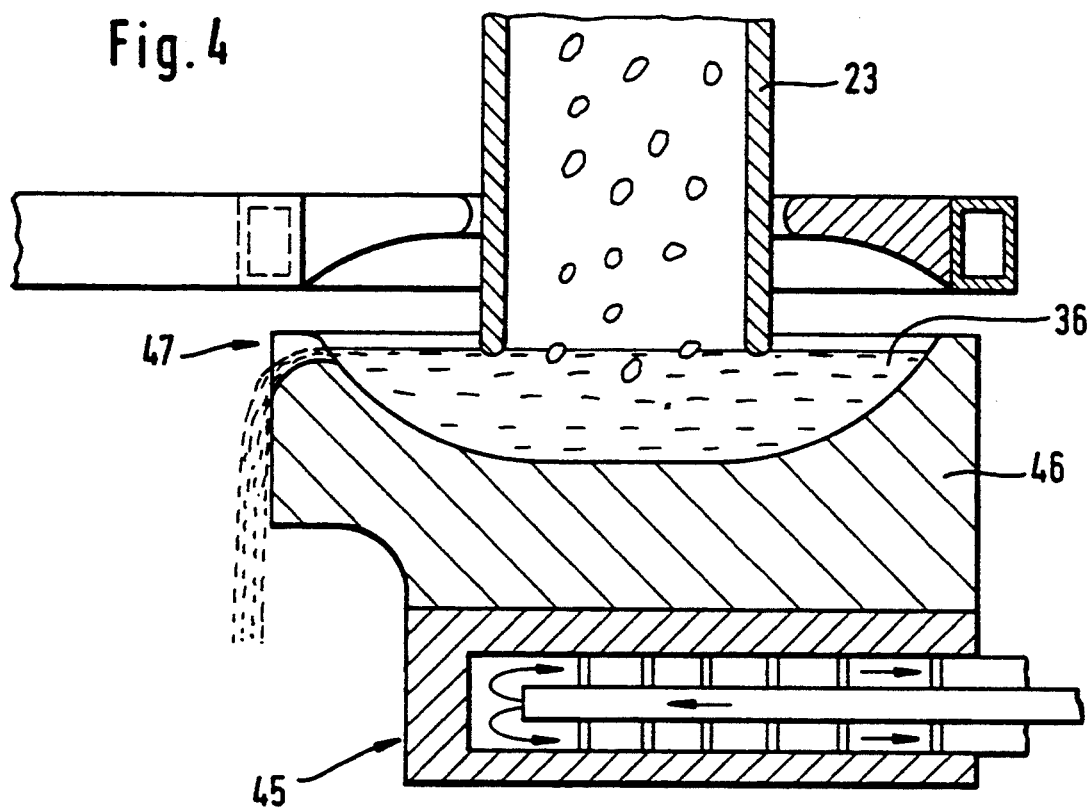
FIG. 4 shows a third embodiment for charging the pre-fusion crucible with an induction heater and a cooling system.
Figure 5:
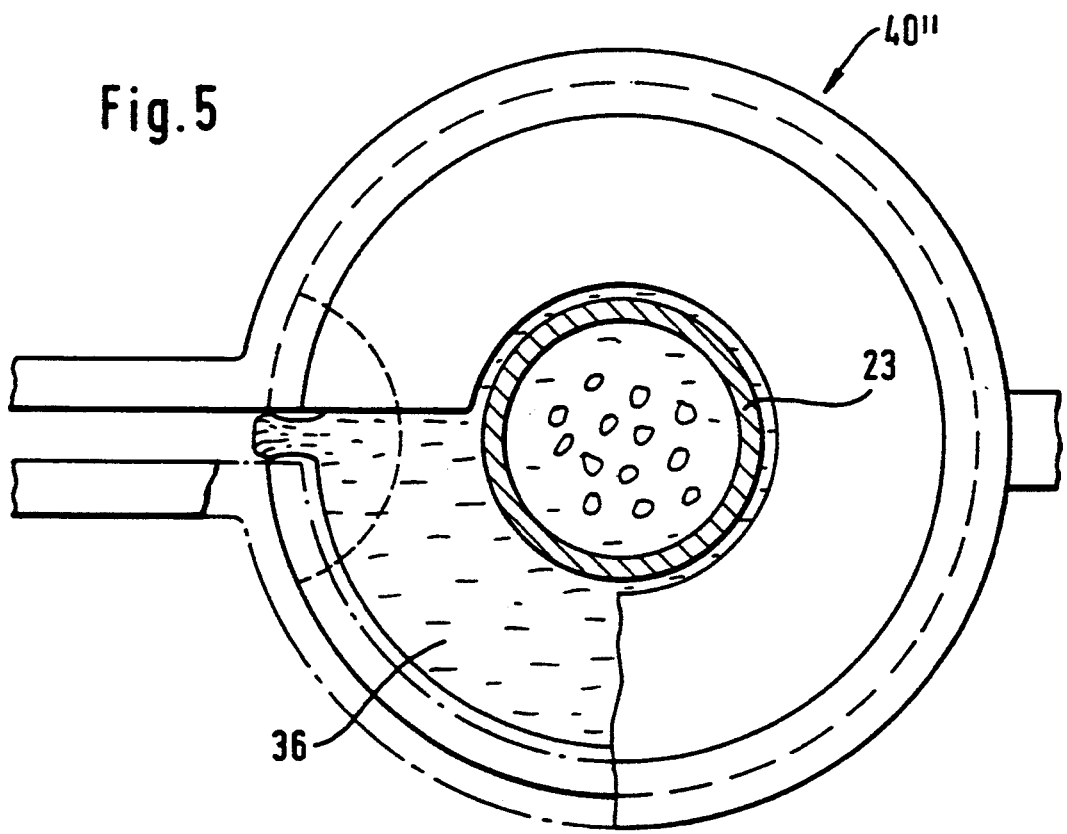
FIG. 5 is a plan view of the prefusion crucible of FIG. 4.

According to an additional embodiment represented in FIGS. 4 and 5, a cooling system 45 can be arranged with the pre-fusing crucible 25 such that the charge material can be fused in a cooled silicon bed.

The silicon source can, according to FIG. 4, be a silicon block 46 which is at least partially melted away by means of the induction heater 40" such that a portion is melted out in the silicon block 46 as an overflow channel 47.

The surface of the silicon block 46 can also be scanned by means of an electron beam so that then the pre-fused Si is fed to the crucible through an overflow channel 47 scanned into the silicon block 46.

A plasma heater, an electron beam heater, a resistance heater or an induction heater 40" can be provided as the heater.

All of the embodiments have the same purpose, namely to liquefy the charge material outside of the melting crucible 14, and then feed it steadily in the molten state to the melting crucible 14 and pulling means 43. This prevents the cold granules 37 from dropping directly into the melt, causing dust to rise and contaminate the monocrystal. According to FIG. 1, the molten granules drip down through the overflow system 35 to the intermediate stage or pre-fusing crucible 25 and is then fed to the melt for the pulling means 43.

In order to bind any dust which may be present, an argon gas stream 49 is fed during the pouring of the granules 37; it is let into the vacuum chamber through an airlock (cf. FIG. 1). By the two measures, a) of the intermediate melting and b) of the binding the dust with gas, the dust can advantageously be kept outside of the pulling means 43. Since the granules 37 are melted in the intermediate stage, the formerly expensive fusing power in the area of the melt can be reduced.

I claim:

1. Apparatus for the continuous feeding of charge material to a melting crucible in a closed container, said apparatus comprising
    a closed container,
    a melting crucible in said closed container,
    a prefusing crucible for melting charge material to form a molten material having a top surface in said prefusing crucible,
    feed means for providing charge material to the prefusing crucible, and
    overflow means for drawing said molten material from said top surface in the prefusing crucible and feeding said molten material to the melting crucible.

2. Apparatus as in claim 1 further comprising a closed prefusing tank, said prefusing crucible being in said prefusing tank, said feed means comprising feed tube means into said closed prefusing tank.

3. Apparatus as in claim 2 wherein said closed prefusing tank is inside said closed container, said feed tube means passing through said closed container.

4. Apparatus as in claim 3 further comprising cover means arranged over said overflow means to prevent dust introduced into said prefusing tank by said feed tube means from entering said overflow means.

5. Apparatus as in claim 3 wherein said overflow means comprises a drain tube.

6. Apparatus as in claim 1 wherein said prefusing crucible is formed by at least one of SiO$_2$ and Si.

7. Apparatus as in claim 6 wherein said prefusing crucible is made of silicon.

8. Apparatus as in claim 6 further comprising
    heating means for melting said prefusing crucible in the area of said overflow means, and
    cooling means for cooling said prefusing crucible.

9. Apparatus as in claim 1 further comprising a graphite support crucible for said prefusing crucible.

10. Apparatus as in claim 1 wherein said overflow means is situated centrally in said prefusing crucible, said apparatus further comprising cover means arranged over said overflow means to prevent dust introduced into said prefusing tank by said feed tube means from entering said overflow means.

11. Apparatus as in claim 1 wherein said feed means comprises feed tube means extending into said molten material in said prefusing crucible so that dust entering said crucible by said feed tube means cannot reach said overflow means.

* * * * *